US 6,670,620 B1

United States Patent
Okunuki

(10) Patent No.: US 6,670,620 B1
(45) Date of Patent: Dec. 30, 2003

(54) ELECTRON GUN, ILLUMINATION APPARATUS USING THE ELECTRON GUN, AND ELECTRON BEAM EXPOSURE APPARATUS USING THE ILLUMINATION APPARATUS

(75) Inventor: Masahiko Okunuki, Akiruno (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/461,835

(22) Filed: Dec. 16, 1999

(30) Foreign Application Priority Data

Dec. 18, 1998 (JP) ............................................. 10-361040

(51) Int. Cl.$^7$ ................................................. H01J 37/30
(52) U.S. Cl. ..................... 250/492.2; 250/398; 250/423; 250/423 F; 313/336; 313/346 R; 315/3; 315/533
(58) Field of Search ......................... 250/492.2, 492.23, 250/398, 423, 423 F; 313/336, 346 R; 315/3, 533

(56) References Cited

U.S. PATENT DOCUMENTS

| | | | |
|---|---|---|---|
| 4,894,611 A | 1/1990 | Shimoda et al. | 324/158 R |
| 4,896,945 A | 1/1990 | Okunuki et al. | 250/492.2 |
| 4,897,552 A | 1/1990 | Okunuki et al. | 250/492.2 |
| 4,974,736 A | 12/1990 | Okunuki et al. | 219/121.12 |
| 5,633,507 A * | 5/1997 | Pfeiffer et al. | 250/492.23 |
| 6,087,667 A * | 7/2000 | Nakasuji et al. | 250/492.2 |
| 6,232,040 B1 * | 5/2001 | Katsap et al. | 430/296 |

FOREIGN PATENT DOCUMENTS

| | | |
|---|---|---|
| JP | 9-139185 | 5/1997 |
| JP | 10-135102 | 5/1998 |

OTHER PUBLICATIONS

K. Saito et al., "A 100 kV Electron Gun for the X-Ray Mask Writer, EB-X2", *Society of Photo-Optical Instrumentation Engineers*, vol. 2858, p. 2–12 (Aug. 1996).

S.D. Berger, et al., "Projection Electron Beam Lithography: A New Approach", *J. Vac. Sci. Technol.*, B9, pp. 2996–2999 (Jul. 1991).

* cited by examiner

Primary Examiner—John R. Lee
Assistant Examiner—Zia R. Hashmi
(74) Attorney, Agent, or Firm—Fitzpatrick, Cella, Harper & Scinto

(57) ABSTRACT

An electron gun, having an electron source, a Wehnelt electrode, and acceleration electrodes, includes a control device for changing a field distribution formed by a first acceleration electrode of the acceleration electrodes to control characteristics of a final cross-over formed, by electrons from a first cross-over, at the final stage of the electric gun. The first cross-over is performed when the electrons emitted from the electron source are focused by the field distribution formed by the electron source, the Wehnelt electrode, and a second acceleration electrode of the acceleration electrodes.

24 Claims, 8 Drawing Sheets

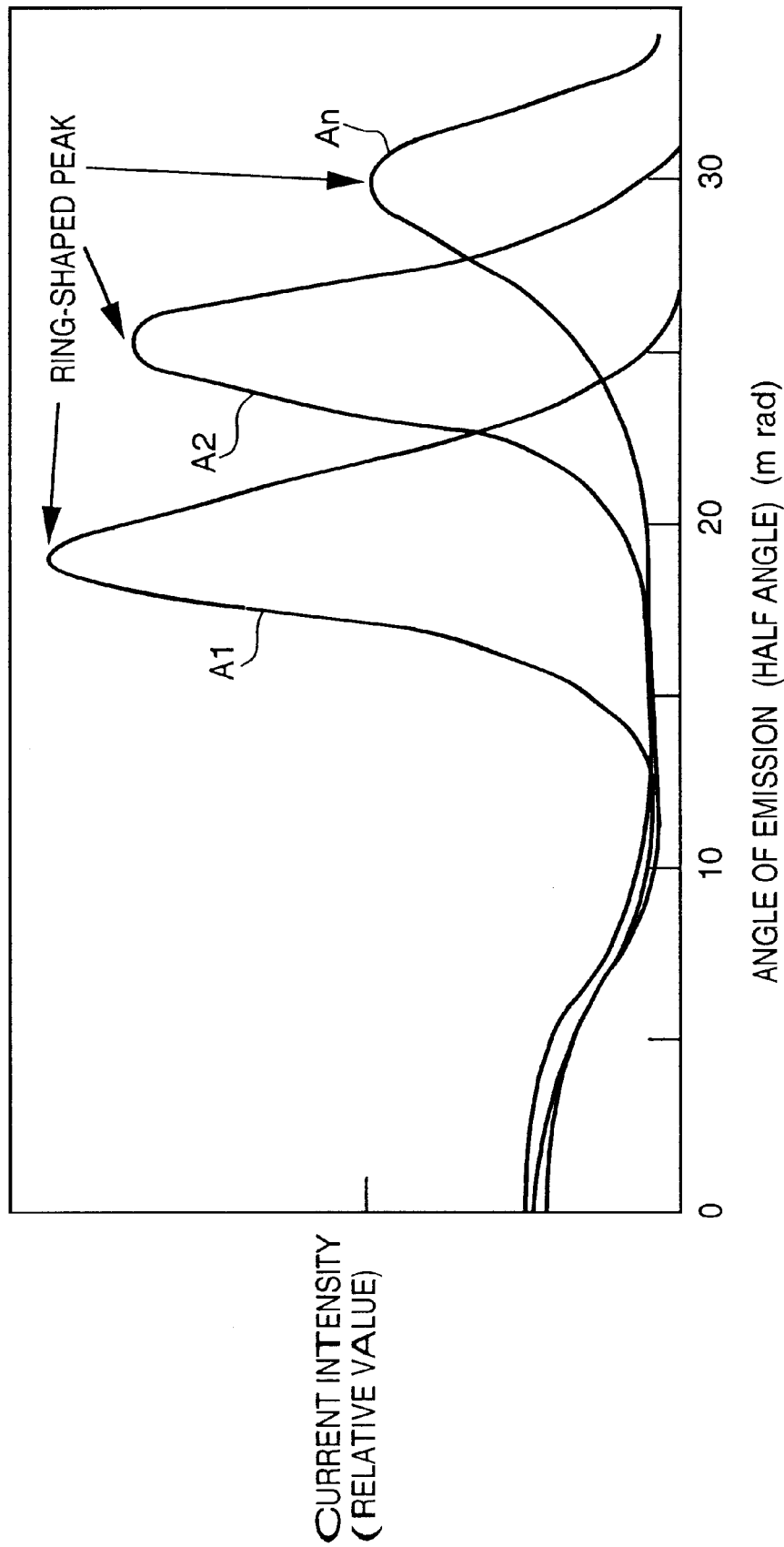

IRRADIATION BEAM SHAPE

ELECTRON GUN, ILLUMINATION APPARATUS USING THE ELECTRON GUN, AND ELECTRON BEAM EXPOSURE APPARATUS USING THE ILLUMINATION APPARATUS

BACKGROUND OF THE INVENTION

The present invention relates to an electron gun, an illumination apparatus using the electron gun, and an electron beam exposure apparatus using the electron gun, which are used for lithography in the manufacture of semiconductor devices.

In the mass production process of the manufacture of semiconductor memory devices, an optical stepper with high productivity is used. 1 G or 4 G DRAMs and memory devices having larger capacities than 1 G or 4 G DRAMS have a line width of 0.2 $\mu$m or less. To produce them, electron beam exposure methods with high resolution and productivity are expected as one of exposure techniques replacing the optical exposure schemes.

The mainstreams of conventional electron beam exposure schemes are the Gaussian scheme and variable shaping scheme using a single beam. These electron beam exposure schemes are poor in productivity and are used for limited applications such as mask drawing, research and development of VLSI or ULSI, or production of a small quantity of ASIC devices. To apply electron beam exposure to mass production, how to improve the productivity is important. As one solution to this problem, an electron beam exposure apparatus of full-plate transfer type as shown in FIG. 4A has been proposed recently. In this scheme, a repeated portion of a memory circuit pattern is divided into several-$\mu$m cell regions to decrease the number of exposure shots. This improves the productivity.

In an exposure apparatus, the exposure line accuracy is important as is productivity. To ensure performance, the uniformity of the irradiation intensity in exposure regions is required to be 1% or less in all exposure regions. The full-plate exposure area of the above full-plate exposure scheme is about 5 $\mu$m$^2$. The focus half-angle of the projecting lens is set at several m rad in consideration of the resolution condition of lens aberration. Let $\epsilon$ be the emittance defined by the product of the cross-over diameter of the electron gun and the irradiation beam extraction half-angle. At this time, the condition required for uniform illumination is represented by $\epsilon$> exposure region x focus half-angle of lens $\approx$10 $\mu$m rad.

The energy of the exposure electron beam is about 50 keV. An electron gun having a triode electron gun structure as shown in FIG. 4A is used. To obtain uniform irradiation electron beam components from an electron beam emitted from the electron gun, beam components within the range of several m rad with satisfactory characteristics are selected from the electron beam emitted at several tens of m rad and used as the irridiation beam, as shown in FIG. 4B.

In recent years, to further widen the exposure area to improve the productivity, for example, the SCALPEL scheme (S. D. Berger et al. "Projection electron beam lithography: A new approach." J. Vac. Sci. Technology B9, 2996 (1991)) has been proposed as an electron beam transfer/exposure scheme using an electron beam scattering mask. This scheme can increase the exposure area by 2,500 times or more as compared to the conventional variable shaping scheme or full-plate transfer/exposure scheme. Since the influence of interaction between electrons due to the Coulomb effect can be reduced, the beam current can be increased by one or more orders of magnitudes, so high productivity can be expected. For an exposure area of 250 $\mu$m$^2$ and an electron beam focus half-angle of 2 m rad, the emittance condition required for the electron gun of the SCALPEL exposure scheme is emittance $\epsilon$>700 $\mu$m•m rad. An electron gun having an emittance higher than that of the conventional electron gun by about 100 times is necessary.

To further increase the exposure area to improve the productivity, an EB mask transfer/exposure apparatus (Japanese Patent Laid-Open No. 10-135102) using an arcuated beam has been proposed. As the characteristic feature of this exposure scheme, an arcuated beam sandwiched by two arcs centered on the optical axis is used to reduce the curvature of field of the projecting lens, thereby increasing the exposure area. When an arcuated beam having an arc length of 3 mm, width of 0.1 mm, and a focus half-angle of 1 to 2 m rad is extracted from a circularly emitted electron beam as an exposure region, the electron gun of this scheme requires an emittance higher than that of the above-described SCALPEL scheme by 5 times or more.

When arcuated beam components are extracted from the planar electron beam emitted from the electron gun to form an arcuated beam, the utilization efficiency of the electron beam emitted from the electron gun is as low as about 1/1000. Hence, it is very difficult to obtain a stable electron beam because of the problems of heat and load of the power supply of the electron gun.

FIG. 5 is a view showing the relationship between the brightness and emittance of the electron guns required for each electron beam exposure apparatus. A brightness B represents a value determined by a current density J (A/cm$^2$) and a focus half-angle $\alpha$ (radian) of the exposure region determined by each exposure scheme (B=J/$\pi\alpha^2$ (A/cm$^2$sr)). Although a conventional full-plate transfer apparatus has an exposure region area of 5 $\mu$m$^2$, a planar beam transfer apparatus has a rectangular exposure region of several hundred $\mu$m$^2$. This scheme is called a planar beam scheme in contrast to the arcuated beam scheme. This includes the above-described SCALPEL scheme.

All the exposure apparatuses for which the relationship between the brightness and emittance of the electron gun shown in FIG. 5 is required increase the exposure area to improve the productivity. However, an electron gun capable of uniformly irradiating the irradiation region is hard to obtain. The difficulty increases as the emittance becomes high.

An electron beam exposure scheme with high productivity requires not only a high emittance but also an electron gun capable of selecting the brightness and emittance condition in accordance with a condition that the size of the arcuated beam to be used is 1 to 3 mm, and the focus half-angle is 1 to 2 m rad, as in the arcuated beam transfer apparatus shown in FIG. 5.

In an electron beam transfer/exposure scheme using a scattering EB mask, the electron beam energy must be increased to about 100 keV or more to reduce the influence of electron scattering of an electron beam passing through the EB mask substrate. In the conventional electron gun having the triode structure, it is difficult to suppress high-voltage discharge and obtain a stable electron beam. As a measure against discharge of this electron gun, a multi-stage acceleration electron gun is used in general. Assume that the second acceleration electrode for forming an electric field for the second cross-over following the first cross-over is disposed on the rear side of the first acceleration electrode.

According to the arrangement and voltage setting method of a conventional acceleration electrode, when the voltage of the first acceleration electrode is adjusted, the characteristics of the first and second cross-over simultaneously change. For this reason, an electron gun requiring high emittance characteristics or an illumination apparatus using such an electron gun has poor controllability and is difficult to adjust.

SUMMARY OF THE INVENTION

It is an object of the present invention to provide a practical electron gun which stably operates against a high voltage and has high emittance characteristics and also a large exposure area, large irradiation current, high uniformity of the irradiation current, and excellent controllability, which are required for a high-throughput electron beam exposure apparatus, and an illumination apparatus and electron beam exposure apparatus using the electron gun. In order to achieve the above object, an electron gun according to the present invention, an illumination apparatus using the electron gun, or an electron beam exposure apparatus using the electron gun has the following arrangement.

More specifically, there is provided an electron gun having an electron source, a Wehnelt electrode, and at least one acceleration electrode, comprising:

final cross-over characteristic control means for changing a field distribution formed by one of the acceleration electrodes to control characteristics of a cross-over formed at the final stage of the electron gun.

There is also provided an illumination apparatus comprising the above-described electron gun to emit irradiation light with which an illumination object is illuminated.

There is also provided an electron beam exposure apparatus comprising the above-described electron gun to emit irradiation light with which an exposure object is exposed.

There is also provided an electron beam exposure apparatus, using an arcuated beam, comprising the above-described electron gun to emit irradiation light with which an exposure object is exposed.

There is also provided an electron beam exposure apparatus, using a planar beam, comprising the above-described electron gun to emit irradiation light with which an exposure object is exposed.

According to a preferred aspect of the present invention, in the electron gun, the final cross-over characteristic control means controls characteristics of a cross-over formed, at a rear-side position of at least one acceleration electrode, by an electron beam to control the characteristics of the final cross-over, the electron beam emerging from a first cross-over formed when an electron beam emitted from the electron source is accelerated and focused by a field distribution formed by the electron source, the Wehnelt electrode, and the first acceleration electrode, and being accelerated and focused by a field distribution formed by at least one acceleration electrode located on a rear side of the first acceleration electrode.

According to the preferred aspect of the present invention, in the electron gun, the final cross-over characteristic control means comprises an acceleration electrode position control unit for changing and controlling a set position of one of the acceleration electrodes of at least one acceleration electrode.

According to the preferred aspect of the present invention, in the electron gun, one of the acceleration electrodes is located at the final stage of the electron gun.

According to the preferred aspect of the present invention, in the electron gun, the final cross-over characteristic control means comprises an acceleration correction electrode located on the front side of one of the acceleration electrodes to control a field distribution formed by the acceleration electrode, and a correction voltage control unit for controlling a voltage to be applied to the acceleration correction electrode.

According to the preferred aspect of the present invention, in the electron gun, one of the acceleration electrodes is located at the final stage of the electron gun.

According to the preferred aspect of the present invention, in the electron gun, a distance between the acceleration correction electrode and an acceleration electrode on a rear side is smaller than that between the acceleration correction electrode and an acceleration electrode on a front side.

According to the preferred aspect of the present invention, in the electron gun, a high-voltage power supply for supplying power to the acceleration correction electrode is arranged independently of the electron source and a high voltage power supply of a first acceleration voltage.

According to the preferred aspect of the present invention, in the electron gun, the electron source comprises a thermionic source having a ring-shaped electron emitting surface with a concave central portion and a projecting peripheral portion, and an angle-current distribution of a cross-over formed by an electron beam emitted from the electron emitting surface has a ring shape.

According to the preferred aspect of the present invention, in the electron gun, the electron source has a flat or spherical electron emitting surface.

According to the preferred aspect of the present invention, in the electron gun, at least one acceleration electrode is a second acceleration electrode positioned on a rear side of a first acceleration electrode.

According to the preferred aspect of the present invention, in the electron beam exposure apparatus, the final cross-over characteristic control means controls characteristics of the cross-over formed at the final stage of the electron gun in accordance with at least one of a resolution required for exposure and an exposure area.

According to the preferred aspect of the present invention, in the electron beam exposure apparatus, the final cross-over characteristic control means controls characteristics of the cross-over formed at the final stage of the electron gun in accordance with a change of a Wehnelt voltage.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 1B is a graph showing the angle-current distribution of a second cross-over $CO2$ of the electron gun shown in FIG. 1A;

DETAILED DESCRIPTION OF THE PREFERRED EMBODIMENTS

Preferred embodiments of the present invention will be described below in detail in accordance with the accompanying drawings.

First Embodiment

An embodiment of the present invention will be described below in detail with reference to the accompanying drawings.

Figure 1A:
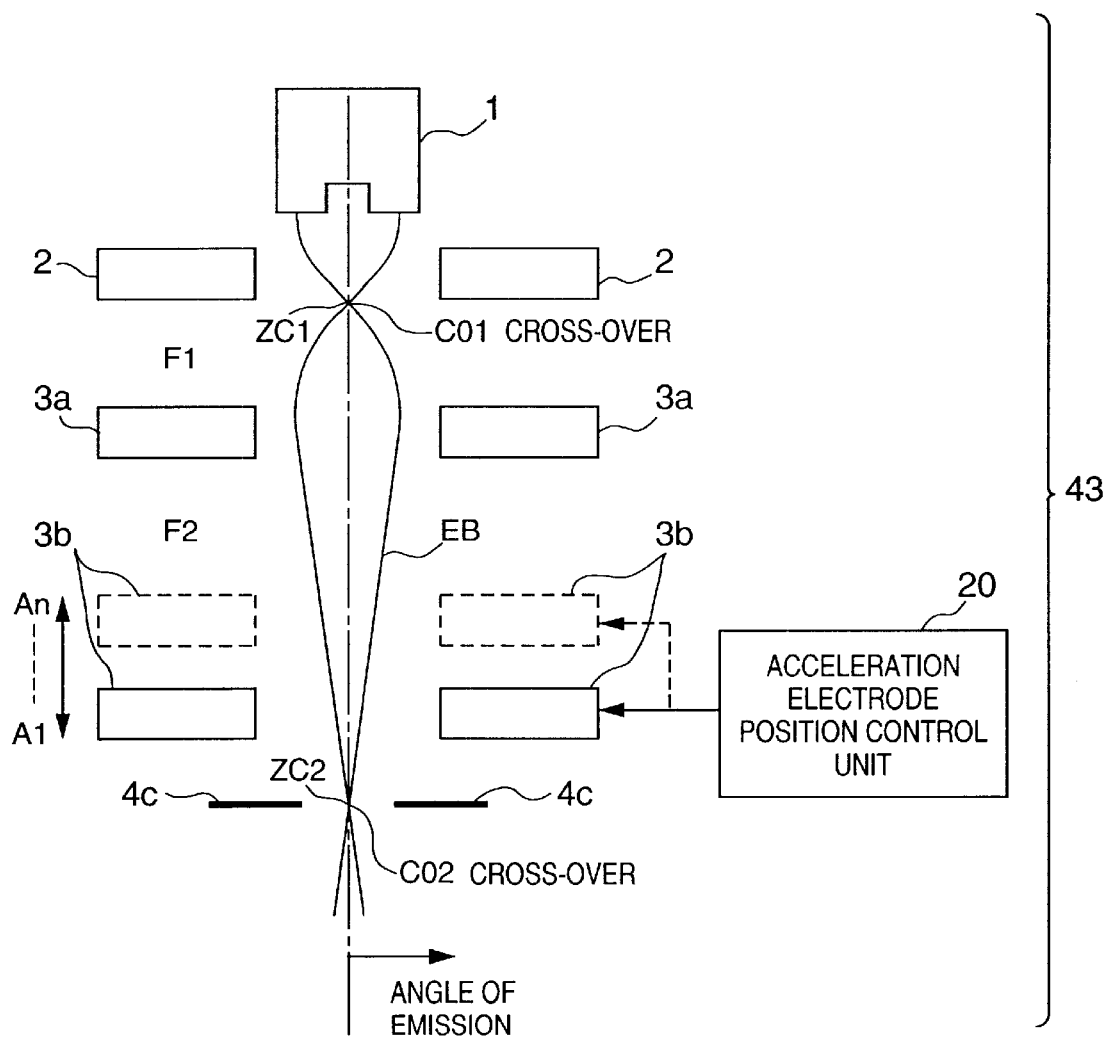
FIG. 1A is a view showing the arrangement of an electron gun according to the first embodiment of the present invention.

FIG. 1A is a view showing the arrangement of an electron gun according to the first embodiment of the present invention. FIG. 1B is a graph showing the angle-current distribution of a second cross-over CO2 of the electron gun shown in FIG. 1A.

An electron gun 43 shown in FIG. 1A is constructed by an $LaB_6$ electron source 1 having a circular ring shape, Wehnelt electrode 2, first acceleration electrode 3a, second acceleration electrode 3b whose position can be changed, acceleration electrode position control unit 20 for adjusting the position of the second acceleration electrode, and aperture 4c. Since the ring-shaped surface of the electron source 1 forms a high field strength, an angle-current distribution having a large ring-shaped peak in the large angle region is obtained from the current density on the electron emitting surface of the electron source 1. A front-side field distribution F1 formed by the electron source 1, Wehnelt electrode 2, and first acceleration electrode 3a forms a cross-over CO1 at a position ZC1. In the cross-over CO1, the field distribution F1 is adjusted such that the angle-current distribution of the electron beam emitted from the electron emitting surface of the ring-shaped electron source has a ring-shaped peak.

An electron beam EB from the cross-over CO1 forms a field distribution F2 on the rear side by the second acceleration electrode 3b, whereby the second cross-over CO2 is formed at a position ZC2 on the rear side of the second acceleration electrode 3b. As for the angle-current distribution of the second cross-over CO2, the field distribution F2 is changed by changing the position of the second acceleration electrode 3b to A1, A2 and An by the acceleration electrode position control unit 20. The angle of emission of the peak of the ring-shaped beam at the second cross-over CO2 changes accordingly, as shown in FIG. 1B. Hence, when the position of the second acceleration electrode 3b is changed, the emission characteristics, i.e., angle-current distribution characteristics of the second cross-over CO2 can be adjusted.

In this case, the strength of the field distribution F2 increases when the position of the second acceleration electrode 3b is shifted to the electron source 1 side. Hence, the convex lens function of the acceleration lens increases. The cross-over position ZC2 shifts to the electron source side, and simultaneously, the ring-shaped peak shifts to the large angle side. While the voltage of the first acceleration electrode 3a and the acceleration voltage of the electron source are fixed, i.e., without changing the field distribution F1, the angle-current distribution and position ZC2 of the cross-over CO2 can be adjusted, and the characteristics of the cross-over CO2 can be adjusted.

As the characteristics of the cross-over CO1 and CO2, not only the angle-current distributions but also the cross-over formation positions ZC1 and ZC2 and characteristics of the brightness are also variable. These characteristics are adjusted in accordance with the irradiation and exposure conditions of the electron beam exposure apparatus. When the acceleration voltage of the electron gun 43 is 100 kV, and (100)-plane $LaB_6$ having a ring-shaped electron emitting surface with an outer diameter of 0.7 mm and an inner diameter of 0.5 mm is used as the electron source 1, the angle of emission (half angle) of the ring-shaped peak of the electron beam from the cross-over CO2 is 10 to 30 m rad, and the cross-over diameter is 100 to 200 $\mu$m.

When these are converted into the emittance as a beam that irradiates a ring shape used to irradiate a circular shape, the emittance can be selected from the range of 1,000 to 6,000 $\mu$m•m rad. The brightness of the electron gun (brightness of the second cross-over) changes at this time to about $1\times10^4$ $A/cm^2 sr$. For this reason, characteristics within the necessary range of the brightness and emittance conditions necessary for the arcuated beam transfer apparatus can be obtained. In addition, since the arcuated beam is used, the electron beam amount shielded by the intermediate electrode is small, unlike an electron gun using a planar beam, so the irradiation beam can be efficiently used.

Second Embodiment

Figure 2A:
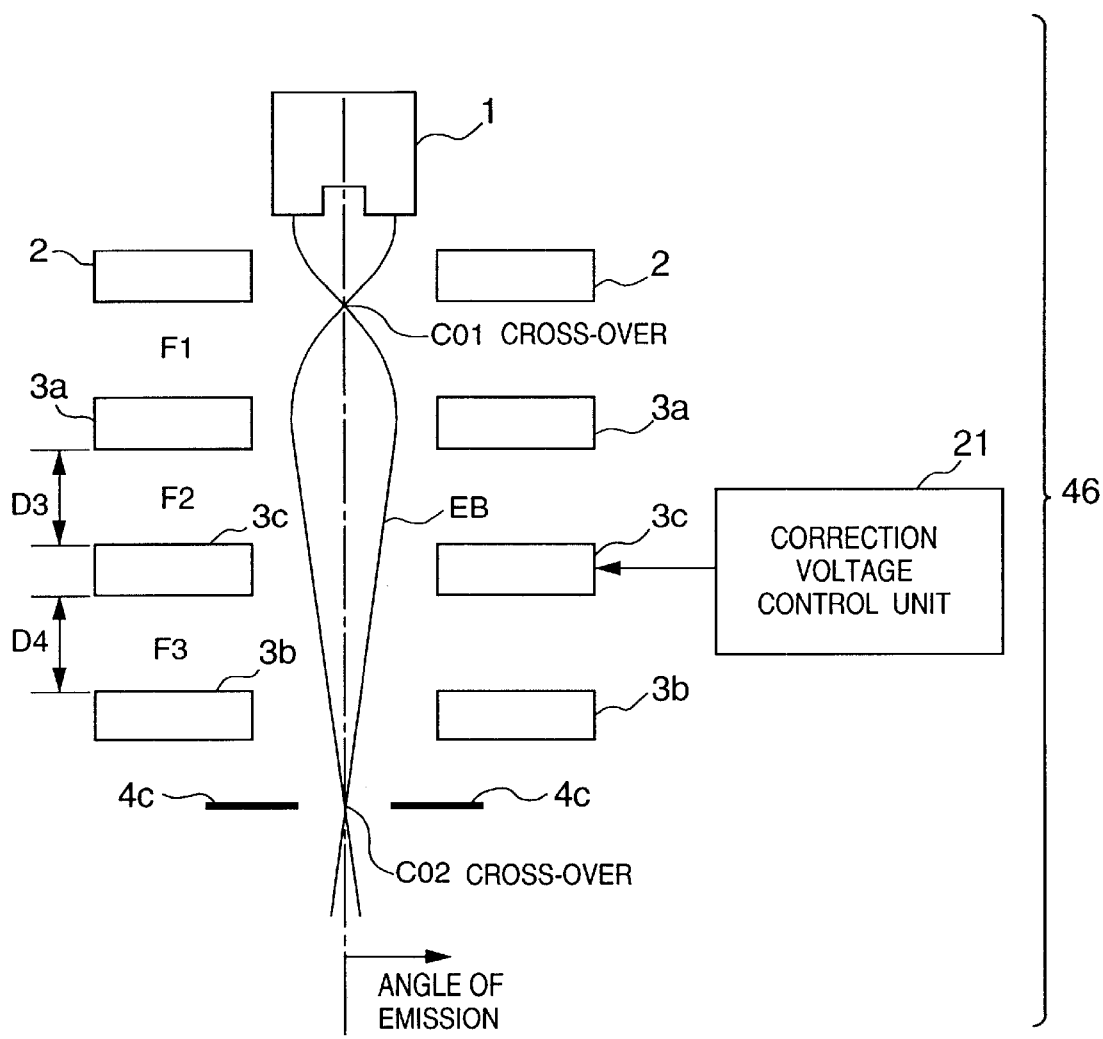
FIG. 2A is a view showing the arrangement of an electron gun according to the second embodiment of the present invention.
Figure 2B:
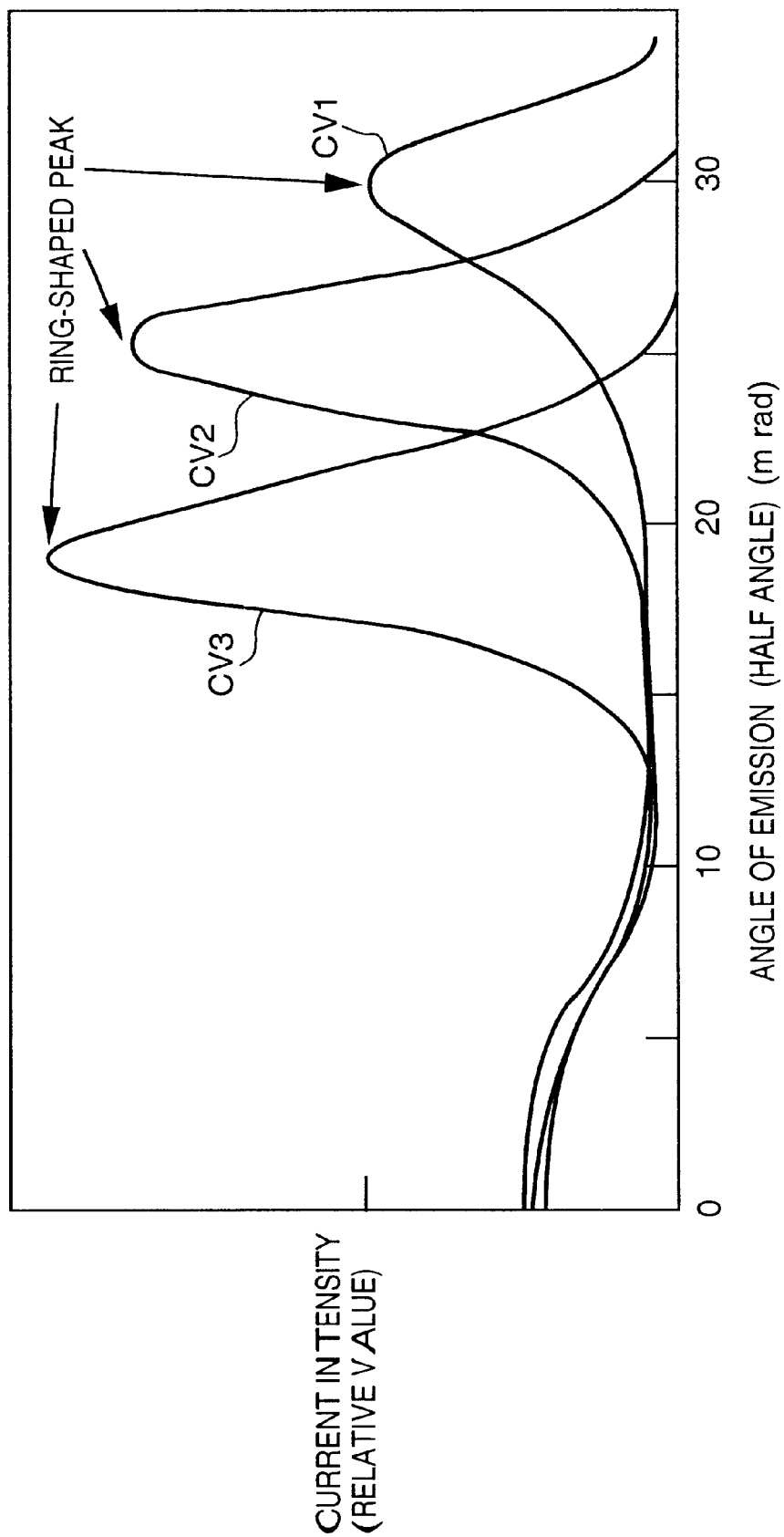
FIG. 2B is a graph showing the angle-current distribution of a second cross-over $CO2$ of the electron gun shown in FIG. 2A.

FIG. 2A is a view showing the arrangement of an electron gun according to the second embodiment of the present invention. FIG. 2B is a graph showing the angle-current distribution.

An electron gun 46 shown in FIG. 2A has an electron source 1 having a ring-shaped electron emitting surface, Wehnelt electrode 2, first acceleration electrode 3a, second acceleration electrode 3b, aperture 4c, and acceleration correction electrode 3c inserted between the first acceleration electrode 3a and the second acceleration electrode 3b. An electron beam EB emitted from the electron source 1 similar to that shown in FIG. 1A obtains an angle-current distribution having a ring-shaped peak in the large angle region in accordance with a field distribution F1 formed by the electron source 1, Wehnelt electrode 2, and first acceleration electrode 3a. The electron beam EB emerging from a cross-over CO1 forms a cross-over CO2 at a position ZC2 in accordance with a field distribution F2 on the rear side, which is formed by the second acceleration electrode 3b. In this case, the voltage to be applied to the acceleration correction electrode 3c in the acceleration lens is controlled by a correction voltage control unit 21, thereby adjusting the field distributions F2 and F3 on the rear side and controlling the angle current distribution of the cross-over CO2.

FIG. 2B is a graph showing the angle-current distribution when the voltage applied to the acceleration correction electrode 3c is changed to CV1, CV2, and CV3. When the acceleration voltage of the electron gun 46 is, e.g., 100 kV, the voltage applied to the acceleration correction electrode 3c is changed within the range of 0 to −30 kV to greatly change the angle of emission of the ring-shaped beam from 10 m rad to 30 m rad. This is because when a negative voltage is applied to the acceleration correction electrode 3c, the strength of the field distribution F2 on the rear side is relaxed. Not only a negative voltage but also a positive voltage can be applied to the acceleration correction electrode 3c as a correction voltage to obtain a similar effect.

The correction means using the acceleration correction electrode 3c sets a distance D3 from the acceleration correction electrode 3c to the first acceleration electrode 3a to be larger than a distance D4 from the acceleration correction electrode 3c to the second acceleration electrode 3b, thereby making the influence of the field distribution F2 dominant. This makes it possible to control the correction voltage of the acceleration correction electrode 3c in accordance with a voltage close to the voltage of the second acceleration electrode 3b (ground voltage). When the correction voltage is supplied separately from the high-voltage power supply of the electron gun, the load on the high-voltage power supply of the electron gun can be reduced. For this reason, an electron gun having high controllability and stability, and an illumination apparatus using the electron gun can be obtained.

In the above-described two embodiments, a two-stage acceleration electron gun having the first and second acceleration electrodes has been described. However, the present invention can also be applied to a multi-stage acceleration electron gun having two or more stages. At this time, the second acceleration electrode 3b may be used as an acceleration electrode aiming at changing the field distribution or a final acceleration electrode of the electron gun.

In the above-described examples, a thermionic source having a ring-shaped electron emitting surface is used as the electron source 1. However, the present invention is not limited to this. An electron source having a flat or spherical electron emitting surface and the emission characteristics in the large angle region can also be used to obtain the same effect as described above.

As described above, according to the electron gun of the present invention, since the first cross-over and second cross-over can be independently adjusted, the brightness and emittance of the electron gun can be set in accordance with the exposure condition of the electron beam exposure apparatus.

Third Embodiment

Figure 3:
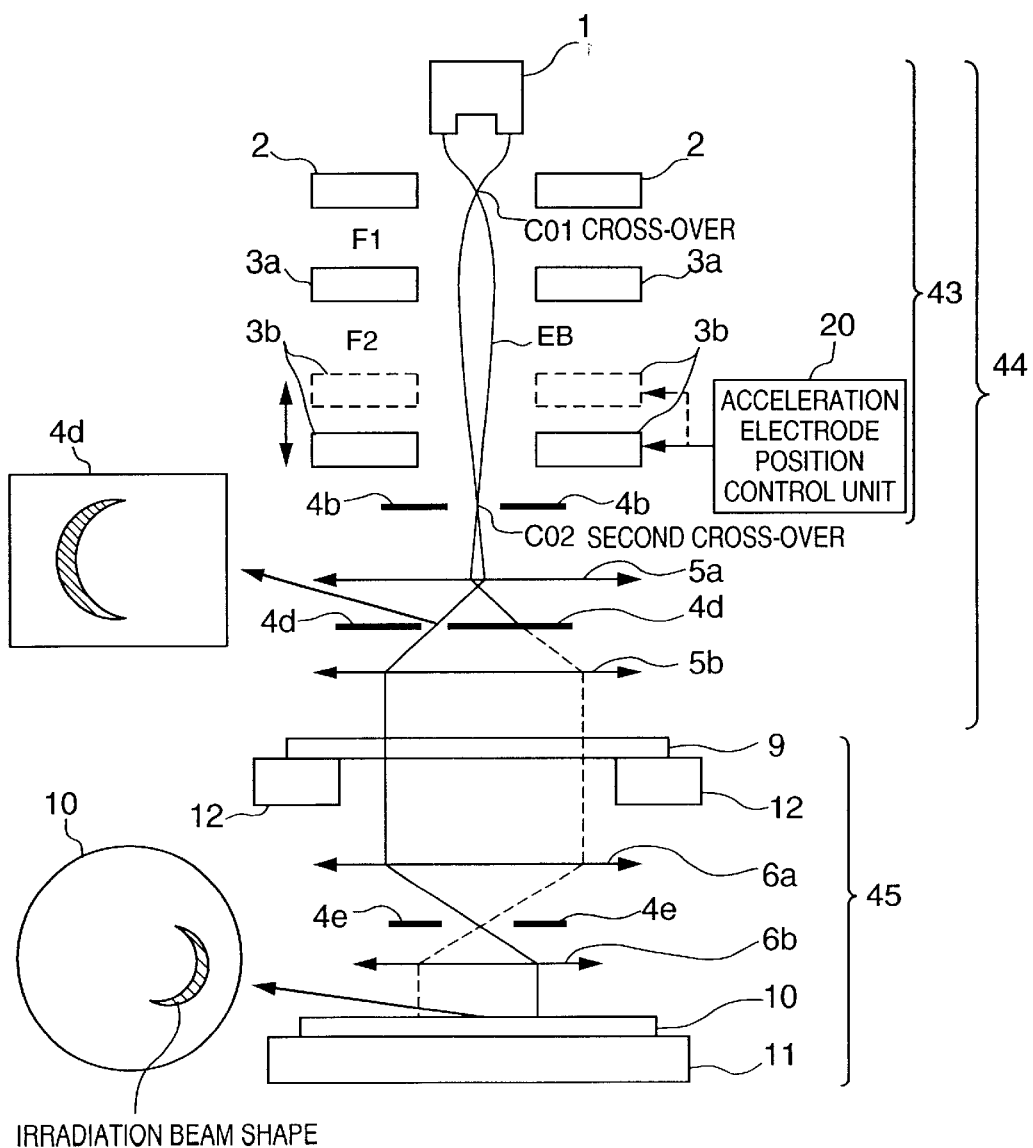
FIG. 3 is an explanatory view of an EB mask transfer apparatus using an arcuated beam.
Figure 4A:
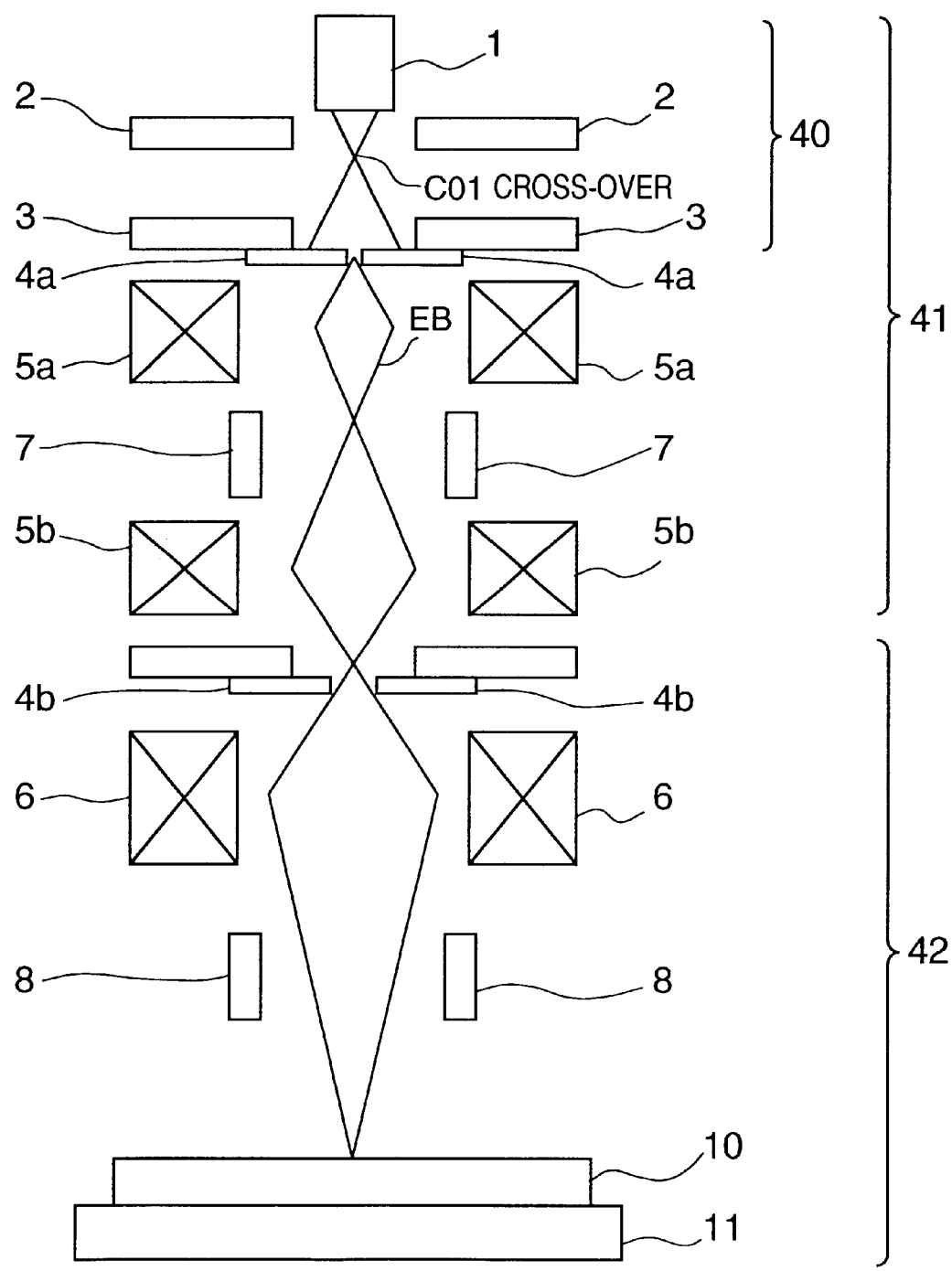
FIG. 4A is an explanatory view of an exposure apparatus of full-plate transfer scheme.
Figure 4B:
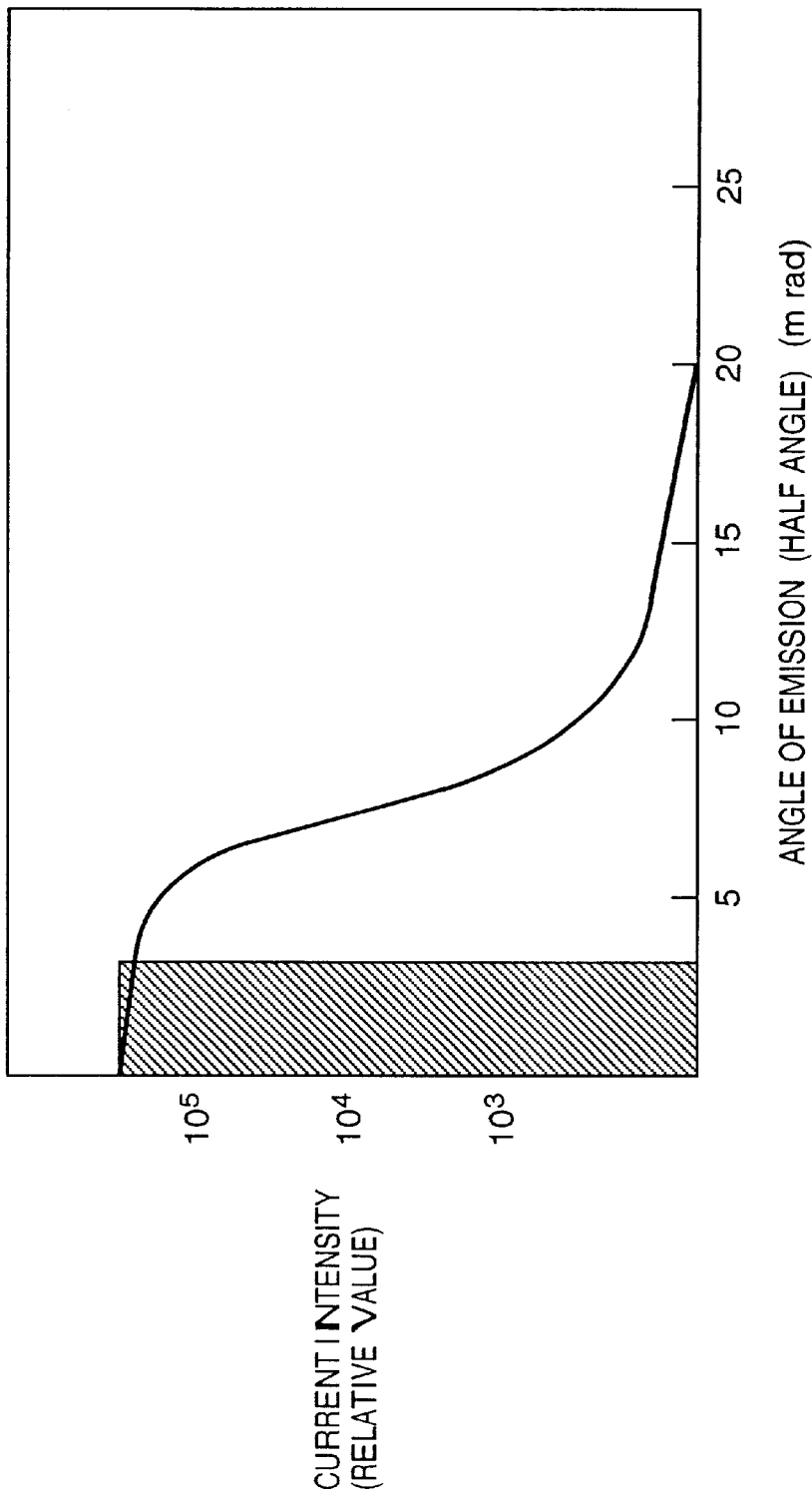
FIG. 4B is a graph showing the electron emission characteristics and irradiation beam region of an electron gun.
Figure 5:
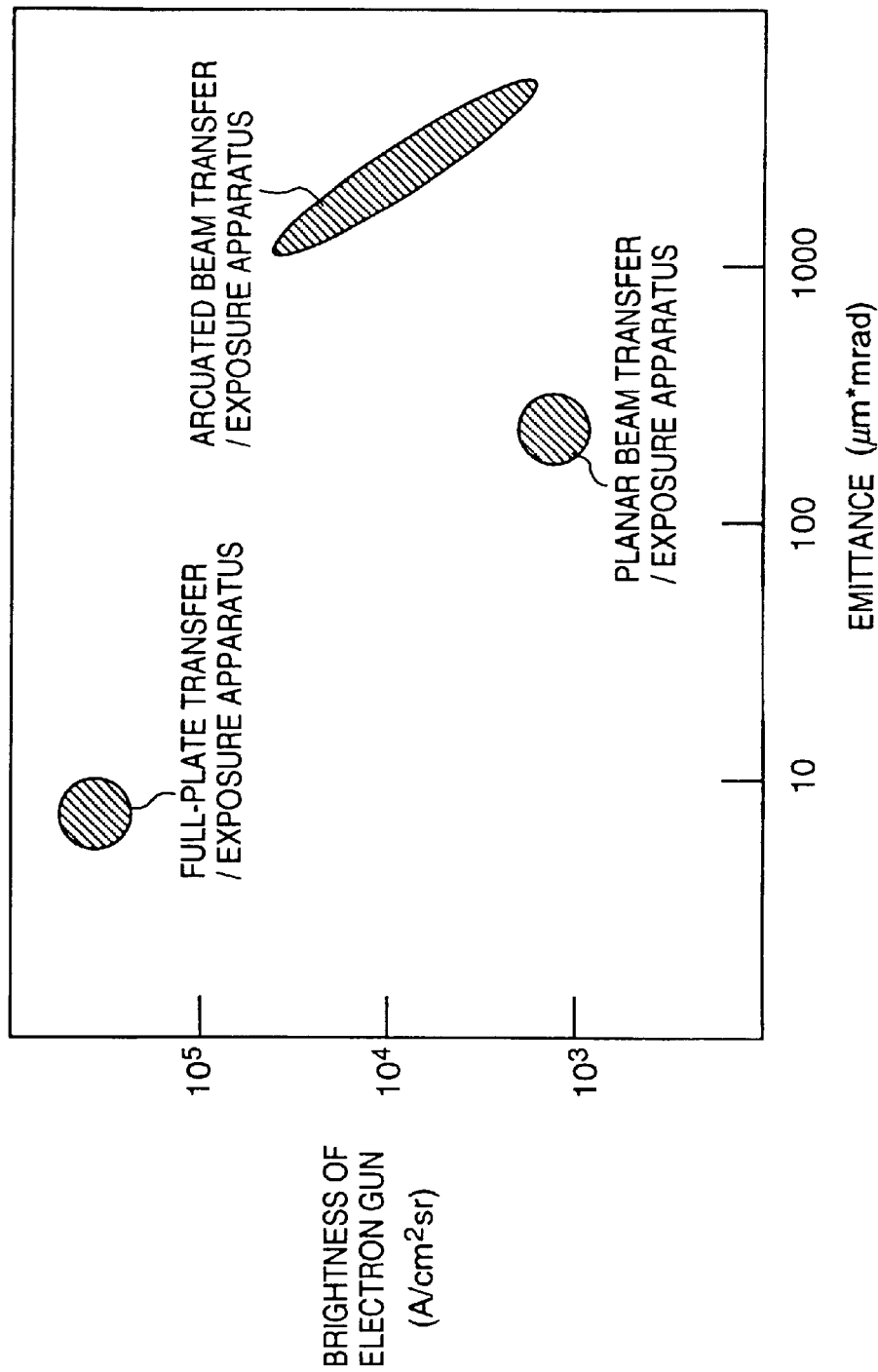
FIG. 5 is a view showing the brightness and emittance characteristics of electron guns required for electron beam exposure apparatuses.

FIG. 3 is a view showing the third embodiment in which the electron gun of the present invention is used for an EB mask transfer/exposure apparatus using an arcuated beam. The EB mask transfer/exposure apparatus shown in FIG. 3 has an illumination apparatus 44 including an electron gun 43, and a projecting unit 45. The emission characteristics of a cross-over CO2 formed by the electron gun 43 have an angle-current distribution having a ring-shaped peak as shown in FIG. 1B. An EB mask 9 is irradiated with the beam through a first illumination lens 5a and second illumination lens 5b. The beam with which the EB mask 9 is irradiated is shaped into an arcuated beam by an arcuated slit 4d. The electron beam transmitted through the EB mask 9 transfers the EB mask image onto a wafer 10 via the projecting unit 45 formed from electromagnetic lenses such as a first projecting lens 6a and second projecting lens 6b. An aperture 4e is used to form the contrast of the image onto the EB mask 9 using an electron scattering mask and is not particularly needed when the EB mask 9 is a transparent mask. A pattern drawn on the EB mask 9 is exposed by repeatedly scanning an EB mask stage 12 and stage 11 to expose the full plate of the wafer. The radius of arc and focus half-angle of the arcuated beam with which the wafer surface is irradiated are set in accordance with a resolution required for exposure. When the exposure area is further increased to increase the throughput, the radius of arc and focus half-angle are controlled using an acceleration electrode position control unit 20 on the basis of the relationship between a field distribution F2 on the rear side and the brightness and emittance of the electron gun which are shown in FIG. 5.

When the electron gun 43 is used for a long time, the intensity of electron emission from an electron source 1 may change in accordance with a change in shape or temperature of the electron source 1. In this case, the emission current can be stabilized by changing the Wehnelt voltage. However, when a field distribution F1 changes, the characteristics of the first cross-over change. The relationship between the change in the Wehnelt voltage and that in the second cross-over characteristics is obtained in advance by an experiment or calculation. In this case, when the field distribution F2 on the rear side is controlled using an electrode position control unit 20, the characteristics of the second cross-over can be made constant. More specifically, the data of the ring-shaped peak position of the angle-current distribution of the second cross-over when the Wehnelt voltage is changed, and the data of the ring-shaped peak position of the angle-current distribution of the second cross-over when the position of a second acceleration electrode 3b, which determines the field distribution F2, is changed are used as control data. The amount of the change in ring-shaped peak position of the angle-current distribution of the second cross-over according to the change in the Wehnelt voltage can be corrected by adjusting the field distribution F2.

In the above description, a thermionic source having a ring-shaped electron emitting surface is used as the electron source 1. However, the present invention is not limited to this electron source shape. The present invention is effective even in an electron source having a flat or spherical electron emitting surface, a multi-stage acceleration electron gun, or an illumination apparatus or electron beam exposure apparatus using this electron gun.

The present invention provides the following effects.

Since the characteristics of the second cross-over can be independently adjusted without changing the condition for the first cross-over of the electron gun, the degree of freedom of adjustment of the electron gun, illumination apparatus, and electron beam exposure apparatus increases, so adjustment can be easily performed.

Since the emittance condition of the electron gun can be optimally set in accordance with the size of the exposure region or convergence half-angle of the exposure beam, the uniformity of the irradiation electron beam in the wide exposure region is improved.

When a thermionic source having a ring-shaped electron emitting surface is used for the electron gun, the utilization efficiency of electrons emitted from the electron gun used in an exposure method using an arcuated beam is improved.

When an electron gun having good stability and controllability and high-energy, high-emittance electron beam characteristics, which are required for an electron beam exposure apparatus using an EB mask, and an illumination apparatus using the electron gun are used, an electron beam exposure apparatus having precise line width accuracy can be realized.

The present invention is not limited to the above embodiments and various changes and modifications can be made within the spirit and scope of the present invention. Therefore, to apprise the public of the scope of the present invention, the following claims are made.

What is claimed is:

1. An electron gun comprising:
   an electron source,
   a Wehnelt electrode,
   an acceleration electrode, wherein electrons emitted from said electron source are affected by a field distribution formed by said electron source, said Wehnelt electrode, and said acceleration electrode, and the electrons form a first cross-over; and
   control means for changing a field distribution formed by another acceleration electrode to control characteristics of another cross-over formed by electrons from the first cross-over.

2. The electron gun according to claim 1, wherein said control means comprises a position control unit for changing a set position of said another electrode.

3. The electron gun according to claim 2, wherein said another electrode is located at the final stage of said electron gun.

4. The electron gun according to claim 1, wherein said control means comprises an acceleration correction electrode located on the front side of said another acceleration electrode to control the field distribution formed by said another electrode, and further comprising a voltage control unit for controlling a voltage to be applied to said acceleration correction electrode.

5. The electron gun according to claim 4, wherein said another electrode is located at the final stage of said electron gun.

6. The electron gun according to claim 4, wherein a distance between said acceleration correction electrode and said another electrode is less than that between said acceleration correction electrode and said acceleration electrode.

7. The electron gun according to claim 4, wherein a high-voltage power supply for supplying power to said acceleration correction electrode is arranged independently of said electron source and a high voltage power supply for said acceleration electrode.

8. The electron gun according to claim 1, wherein said electron source comprises a thermionic source having a ring-shaped electron emitting surface with a concave central portion and a projecting peripheral portion, and an angle-current distribution of a cross-over formed the electrons emitted from the electron emitting surface has a ring shape.

9. The electron gun according to claim 1, wherein said electron source has a flat or spherical electron emitting surface.

10. The electron gun according to claim 1, wherein said another acceleration electrode is a second acceleration electrode positioned on a rear side of the acceleration electrode.

11. The electron gun according to claim 1, wherein said control means comprises a voltage control unit for controlling a voltage to be applied to said another acceleration electrode.

12. The electron gun according to claim 1, wherein said control means controls characteristics of said another cross-over in accordance with a change of Wehnelt voltage.

13. The electron gun according to claim 1, wherein said another cross-over is formed at the final stage of said electron gun.

14. An illumination apparatus comprising:
    an electron source,
    a Wehnelt electrode,
    an acceleration electrode, wherein electrons emitted from said electron source are affected by a field distribution formed by said electron source, said Wehnelt electrode, and said acceleration electrode, and the electrons form a first cross-over;
    control means for changing a field distribution formed by another acceleration electrode to control characteristics of another cross-over formed by electrons from the first cross-over; and
    a lens for directing electrons from said another cross-over to an object to be illuminated.

15. An electron beam exposure apparatus comprising:
    an electron source,
    a Wehnelt electrode,
    an acceleration electrode, wherein electrons emitted from said electron source are affected by a field distribution formed by said electron source, said Wehnelt electrode, and said acceleration electrode, and the electrons form a first cross-over;
    control means for changing a field distribution formed by another acceleration electrode to control characteristics of another cross-over formed by electrons from the first cross-over; and
    a lens for directing electrons from said another cross-over to an object to be exposed.

16. The electron beam exposure apparatus according to claim 15, wherein said control means controls characteristics of said another cross-over in accordance with at least one of a resolution required for exposure and an exposure area.

17. The electron beam exposure apparatus according to claim 15, wherein said control means controls characteristics of said another cross-over in accordance with a change of a Wehnelt voltage.

18. The electron beam exposure apparatus according to claim 15, wherein said electron source comprises a thermionic source having a ring-shaped electron emitting surface with a concave central portion and a projecting peripheral portion, and an angle-current distribution of a cross-over formed by the electrons emitted from the electron emitting surface has a ring shape.

19. The electron beam exposure apparatus according to claim 15, wherein said electron source has one of a flat and a spherical electron emitting surface.

20. A device manufacturing method comprising the steps of:
    (i) providing a wafer; and
    (ii) exposing the wafer by using an electron exposure apparatus,
    wherein said electron exposure apparatus includes:
    (a) an electron source;
    (b) a Wehnelt electrode;
    (c) an acceleration electrode, wherein electrons emitted from the electron source are affected by a field distribution formed by the electron source, the Wehnelt electrode, and the acceleration electrode, and the electrons form a first cross-over;
    (d) control means for changing a field distribution formed by another acceleration electrode to control characteristics of another cross-over formed by electrons from the first cross-over; and
    (e) a lens for directing electrons from said another cross-over to the wafer.

21. An electron gun comprising:
    an electron source;
    a first electrode for collecting electrons emitted from said electron source;
    a plurality of second electrodes for sequentially forming a plurality of cross-overs with the electrons from said first electrode; and means for changing a characteristic of a final cross-over of said plurality of cross-overs.

22. The electron gun according to claim 21, wherein said changing means comprises a changer for changing a filed distribution of a final one of said plurality of second electrodes.

23. An electron beam exposure apparatus comprising:

an electron source;

a first electrode for collecting electrons emitted from said electron source;

a plurality of second electrodes for sequentially forming a plurality of cross-overs with the electrons from said first electrode;

means for changing a characteristic of a final cross-over of said plurality of cross-overs; and a lens for directing electrons from said final cross-over to an object to be exposed.

24. A device manufacturing method comprising the steps of:

(i) providing a wafer; and (ii) exposing the wafer by using an electron exposure apparatus, wherein said electron exposure apparatus includes:

(a) an electron source;

(b) a first electrode for collecting electrons emitted from said electron source;

(c) a plurality of second electrodes for sequentially forming a plurality of cross-overs with the electrons from said first electrode;

(d) means for changing a characteristic of a final cross-over of said plurality of cross-overs; and (e) a lens for directing electrons from said final cross-over to the wafer.

* * * * *

UNITED STATES PATENT AND TRADEMARK OFFICE
CERTIFICATE OF CORRECTION

PATENT NO. : 6,670,620 B1  Page 1 of 1
DATED : December 30, 2003
INVENTOR(S) : Masahiko Okunuki It is certified that error appears in the above-identified patent and that said Letters Patent is hereby corrected as shown below:

<u>Title page,</u>
Item [57], ABSTRACT,
Line 5, "formed," should read -- formed --.

<u>Column 2,</u>
Line 38, "hundred" should read -- hundreds of --.

<u>Column 9,</u>
Line 43, "formed" should read -- formed by --.

<u>Column 11,</u>
Line 4, "filed" should read -- field --.

Signed and Sealed this

Thirteenth Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,670,620 B1
DATED : December 30, 2003
INVENTOR(S) : Masahiko Okunuki It is certified that error appears in the above-identified patent and that said Letters Patent is hereby corrected as shown below:

<u>Title page,</u>
Item [56], References Cited, U.S. PATENT DOCUMENTS,
"4,896,945 A    1/1990    Okunuki et al.    250/429.2" should read
-- 4,896,045 A    1/1990    Okunuki et al.    250/492.2 --.

Signed and Sealed this

Eleventh Day of April, 2006

JON W. DUDAS
*Director of the United States Patent and Trademark Office*